United States Patent
Chuang et al.

[11] Patent Number: 5,930,637
[45] Date of Patent: Jul. 27, 1999

[54] METHOD OF FABRICATING A MICROWAVE INDUCTOR

[75] Inventors: Kuen-Joung Chuang, Ma Kung; Hon-Sung Lui; Wen-Ruey Liaw, both of Hsinchu, all of Taiwan

[73] Assignee: Taiwan Semiconductor Manufacturing Co., Ltd., Taiwan

[21] Appl. No.: 08/961,696

[22] Filed: Oct. 31, 1997

[51] Int. Cl.$^6$ .................................................. H01L 21/465
[52] U.S. Cl. ........................................... 438/381; 257/531
[58] Field of Search ..................................... 438/381, 618, 438/622, 634, 666, 667; 257/531

[56] References Cited

U.S. PATENT DOCUMENTS 5,539,241 7/1996 Abidi et al. .
5,773,870 6/1998 Su et al. .

*Primary Examiner*—Charles Bowers
*Assistant Examiner*—Keith Christianson
*Attorney, Agent, or Firm*—Hayes, Soloway, Hennessey, Grossman & Hage, P.C.

[57] ABSTRACT

Isolation regions are formed on a top surface of a wafer. An ion implantation is performed to implant ions into the wafer. Then, an thermal anneal process is used to form an implanted layer on the wafer. Then, a silicon dioxide or silicon nitride layer is deposited on the implanted layer. Next, a micro inductor is patterned on the insulator layer. Subsequently, a dielectric layer is formed on the inductor for isolation. Next, via holes are created by etching the dielectric layer. A conductive layer is patterned on the dielectric layer and refilled into the via holes. Next, a passivation layer is deposited on the dielectric layer and the conductive layer. An etching is performed to etch the wafer from a bottom surface (a second surface) of the wafer. Finally, a ground plate is connected to the bottom surface (second surface) of the wafer.

15 Claims, 4 Drawing Sheets

METHOD OF FABRICATING A MICROWAVE INDUCTOR

FIELD OF THE INVENTION

The present invention relates to semiconductor process and structure, and more specifically, to a method of forming an inductor for integrated circuits and a structure for same.

BACKGROUND OF THE INVENTION

The advent of Ultra Large Scale Integrated (ULSI) circuits have allowed semiconductor manufacturers worldwide to fabricate semiconductor devices to extremely compact dimensions. The formation of semiconductor devices involves the processes of deposition, lithography, etching and isolation between layers. In order to fabricate integrated circuits (ICs), devices isolated from one another must first be formed in the silicon substrate. With the continuous development of fabrication technology for semiconductor devices, the development of a high density wafer is being carried out at a brisk pace.

Certain applications of ULSI include the use of a microwave device for generating microwave signals. Up to now, a micro inductor, base on has been the choice for acting as one of the elements of the microwave device, because it needs only simple fabrication process. Generally speaking, the such a device includes a micro inductor and a ground plate isolated by insulator, and microwave device can be made by integrated circuits technologies.

In order to reduce the substrate dielectric loss, as shown in FIGS. 1A, 1B, a membrane structure inductor has been used. FIG. 1A shows a cross section view of a conventional membrane structure inductor. The device includes a semiconductor substrate 2 having a cavity 4 formed therein. A ground plate 6 is connected to the lower surface of the substrate 2. An insulator layer 8, such as silicon nitride, is formed on the upper surface of the substrate 2 for isolation. An inductor pattern 10 is patterned on the insulator layer 10 using lithography and etching technologies. A metal layer 12 is used as an airbridge to connect to the inductor pattern 10 using via holes 14. The via holes 14 are typically formed in an isolation layer 16. FIG. 1B is a top view of the inductor pattern 10. It can be seen that an inductor 10 is formed in the area of the membrane window 18.

However, the formation of the membrane is very difficult, and the yield of the device is hard to control. Further, the process of the membrane inductor is not compatible to standard CMOS process.

SUMMARY OF THE INVENTION

Accordingly, the present invention solves the aforesaid disadvantages of the prior art. Included in the preferred embodiment is a semiconductor process for forming an inductor for integrated circuits, which includes isolation regions formed on a upper surface of a wafer. A blanket ion implantation is performed to implant ions into the wafer. Then, an thermal anneal process is used to react the implanted ions with the silicon wafer for forming an implanted layer on the wafer. The implanted layer is act as an etching stop layer for a subsequent step. Then, a silicon dioxide or silicon nitride layer is deposited on the implanted layer to act as an insulator layer. The next step of the present invention is to pattern a micro inductor on the insulator layer using a lithography and an etching processes. The inductor is composed of a first conductive layer, such as metal, alloy or polysilicon. Subsequently, a dielectric layer is formed on the inductor for isolation. Next, via holes are created by etching the dielectric layer. A second conductive layer is patterned on the dielectric layer and refilled into the via holes. Next, a passivation layer is deposited on the dielectric layer and the second conductive layer for protection. An etching is performed to etch the wafer from a lower surface (a second surface) of the wafer. KOH is used as the etchant to etch the wafer. A cavity is generated in the wafer and aligned to the inductor after the step of etching. A ground plate is connected to the lower surface (second surface) of the wafer.

A second embodiment of the present invention discloses a SOI (silicon on insulator) structure that is used as an etching stop layer. A SOI layer is formed by ion implantation in the substrate. Next, isolation regions are formed in the silicon substrate. A silicon dioxide or silicon nitride layer is formed on the silicon layer to act as an insulator layer. A micro inductor is patterned on the insulator layer. Via holes are formed in a dielectric layer, and a connecting conductive layer is patterned on the dielectric layer and refilled into the via holes. Next, a passivation layer is deposited on the dielectric layer and the conductive layer for protection. Similarly, an etching is used to etch the wafer from a lower surface (a second surface) of the wafer. A cavity is also generated and aligned to the inductor to reduce the dielectric loss. A ground plate is connected to the lower surface (second surface) of the wafer.

BRIEF DESCRIPTION OF THE DRAWINGS

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein.

DETAILED DESCRIPTION OF THE PREFERRED EMBODIMENT

A method for fabricating an inductor on a substrate with an implanted layer or a SOI (silicon on insulator) structure is provided below. The SOI insulator structure or the implanted layer is used as an etching stop layer for the present invention. The methods and structures according to the present invention are described as follows.

Figure 1A:
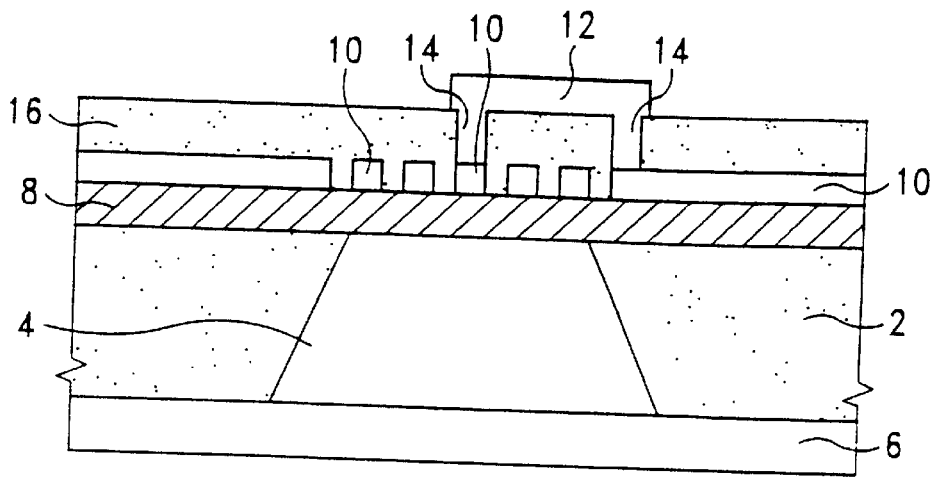
FIG. 1A is a cross-sectional view of a semiconductor wafer illustrating a structure of a membrane inductor formed on a semiconductor wafer in accordance with prior art.
Figure 1B:
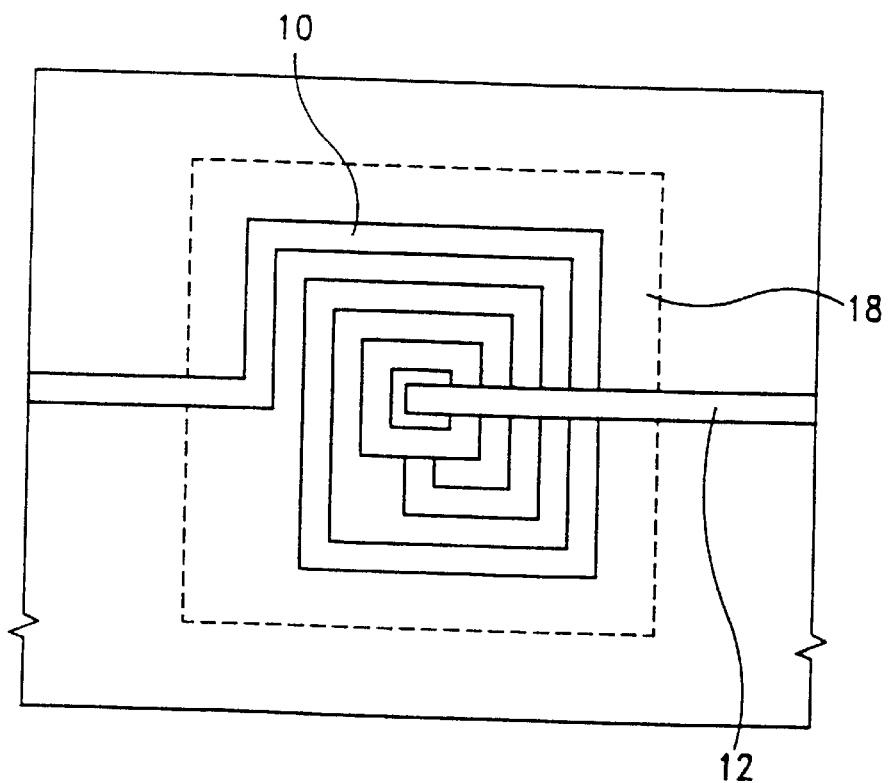
FIG. 1B is a top view of a semiconductor wafer illustrating a membrane inductor pattern formed on a semiconductor wafer in accordance with prior art.
Figure 2:
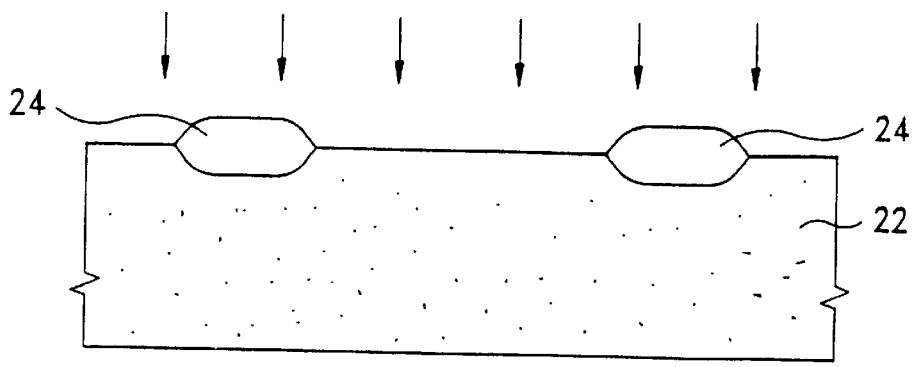
FIG. 2 is a cross-sectional view of a semiconductor wafer illustrating the preferred steps of forming isolation regions and performing an ion implantation into the semiconductor wafer in accordance with the present invention.

In a first embodiment of the present invention, referring to FIG. 2, a single crystal silicon wafer 22 with a <100> crystallographic orientation is provided. Then isolation regions 24 are formed on an upper surface (a first surface) of the wafer 22 using suitable technique, such as field oxidation technology (FOX) or trench isolation technology, to provide isolation between devices. For example, the FOX regions 24 can be formed via photolithography and dry etching steps to etch a silicon nitride-silicon dioxide composition layer. After the photoresist is removed and wet cleaned, thermal oxidation in an oxygen-steam environment is used to grow the FOX region to a thickness of about 3000–8000 angstroms. Then, the silicon nitride-silicon dioxide composition layer is removed.

Also shown in the figure, a blanket ion implantation is performed to implant ions into the wafer 22. The ion source can be $O_2$, $N_2$ or any other suitable molecule.

Figure 3:
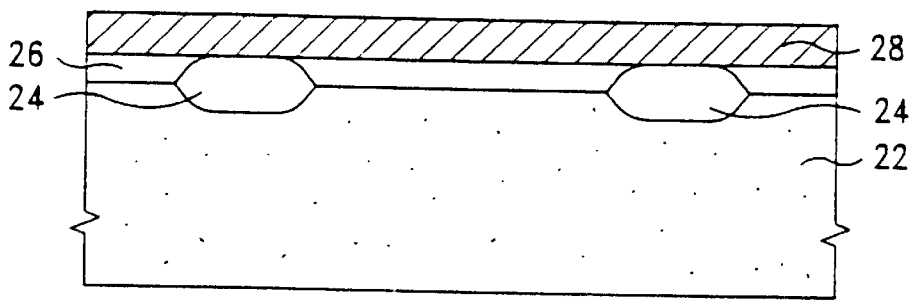
FIG. 3 is a cross-sectional view of a semiconductor wafer illustrating the preferred steps of forming an etching stop layer and an insulator layer in accordance with the present invention.

Turning to FIG. 3, a thermal anneal process is used to react the implanted ions with the silicon wafer 22, thus an implanted layer 26 is formed on the wafer 22. The silicon wafer has a highly selective etching rate composed to the implanted layer 26. The implanted layer 26 acts as an etching stop layer. A silicon dioxide or silicon nitride layer 28 is deposited on the implanted layer 26, as an insulator layer 28. The insulator layer 28 is deposited using a chemical vapor deposition.

Figure 4:
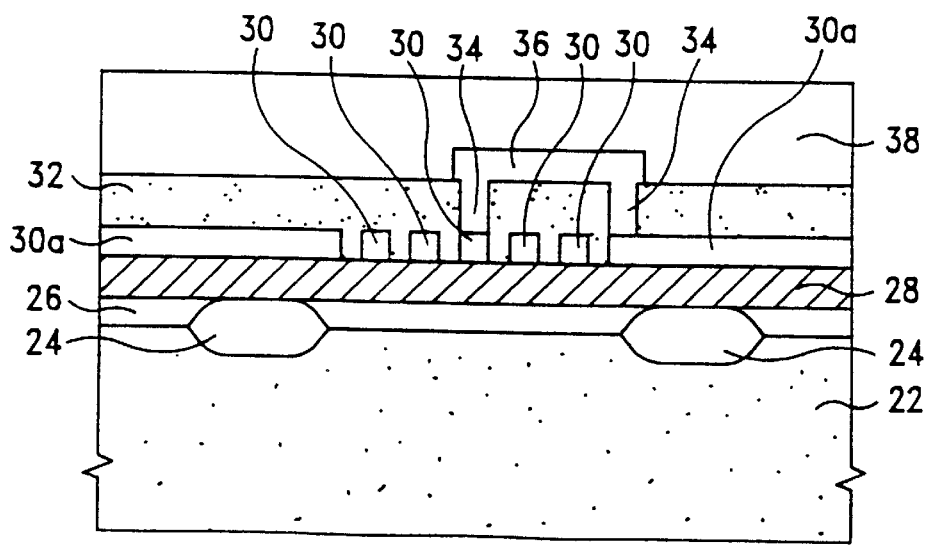
FIG. 4 is a cross-sectional view of a semiconductor wafer illustrating the preferred steps of forming an inductor in accordance with the present invention.

As shown in FIG. 4, the next step of the present invention is to pattern a micro inductor on the insulator layer 28 using a lithography and an etching processes. The principles of inductors are well known in the art. Thus only a cursory description is given herein. The inductor includes a recurrence portion 30 or the like, such as a spiral portion. The recurrence portion is composed of a first conductive layer, such as metal, alloy or polysilicon. Subsequently, a dielectric layer 32 is formed on the inductor 30 for isolation. Typically, the inductor consists of a recurrence portion 30 and a connection portion 30a. The recurrence portion is patterned with a spiral shape. As is well known in the art, the recurrence portion 30 is not limited in spiral shape. In addition, the shape of the recurrence portion 30 is not the primary feature of the present invention, therefore, any suitable shape of the recurrence portion 30 can be used. Next, via holes 34 are created by etching the dielectric layer 32 using a photoresist as an etching mask. One of the via holes 34 is aligned to the central portion of the spiral portion 30, another via hole is aligned to the connection portion 30a. Then, a second conductive layer 36 is patterned on the dielectric layer 32 and refilled into the via holes 34. The second conductive layer 36 is used as an airbridge for connecting the spiral portion 30 and the connection portion 30a. Similarly, metal, alloy or polysilicon can be used as the second conductive layer 36. Next, a passivation layer 38 is deposited on the dielectric layer 32 and the second conductive layer 36, for protection.

Figure 5:
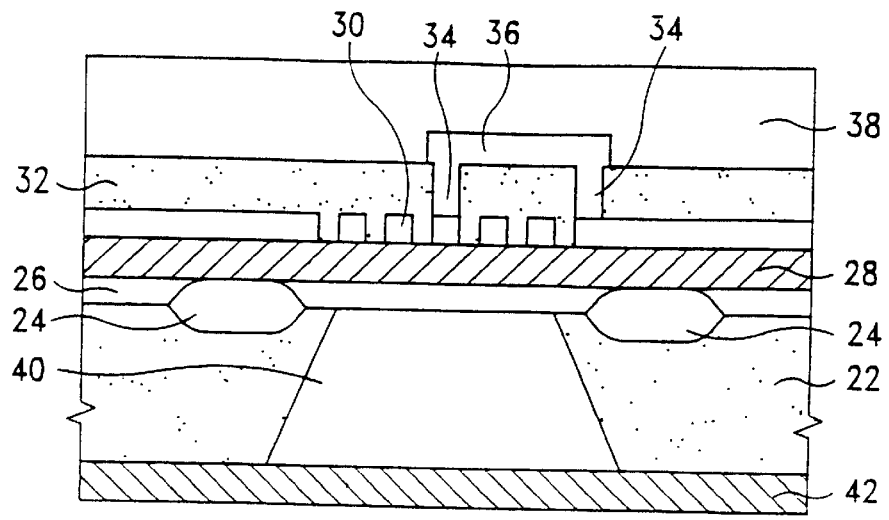
FIG. 5 is a cross-sectional view of a semiconductor wafer illustrating the preferred steps of etching the semiconductor wafer and forming a ground plate in accordance with the present invention.

Turning next to FIG. 5, an etching is performed to etch the wafer 22 from a lower surface (a second surface) of the wafer 22. The etch will be stop at the implanted layer 26. Alkaline, such as KOH, is used as the etchant to etch the wafer 22. After the etching, a cavity 40 is generated in the wafer 22 and aligned to the inductor 30 (recurrence portion 30). The cavity 40 will reduce the dielectric loss during the microwave transmission. Preferably, a ground plate 42 is connected to the lower surface (second surface) of the wafer 22. The ground plate 42 is selected from alloy or metal.

Figure 6:
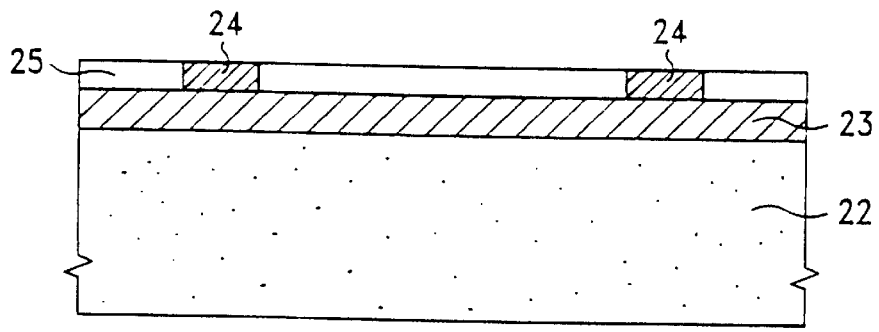
FIG. 6 to FIG. 7 are cross-sectional views of a semiconductor wafer illustrating the preferred steps of forming a microwave device in accordance with a second embodiment of the present invention.

A second embodiment of the present invention discloses a SOI structure that is used as an etching stop layer. As shown in FIG. 6, a single crystal silicon wafer 22 with a <100> crystallographic orientation is provided. An insulator layer 23, such as silicon nitride or silicon dioxide, is formed in the wafer 22 adjacent to the upper surface (first surface) of the wafer 22. The insulator layer 23 has a given depth from the upper surface of the wafer 22, and the insulator layer 23 is formed by SOI process. Ions are implanted into the wafer 22 by ion implantation. By controlling the energy of the implantation, ions can be implanted into a desired depth into the wafer 22. Then, a thermal process is performed to react the implanted ions with the silicon wafer 22, thus the insulator layer 23 is formed in the desired area in the wafer 22. In the cross-sectional view depicted, a portion of the silicon wafer 25 is formed on the insulator layer 23 due to the SOI process. In other words, the insulator layer 23 is formed in the silicon wafer 22, thus forming a structure is similar to a sandwich structure.

The insulator layer 23 has the same function with the implanted layer 26 in the first embodiment of the present invention. Preferably, $O_2$, $N_2$ can be used as the ion source. Next, isolation regions 24 are formed in (or on) the portion of silicon wafer 25, on the insulator layer 23 using suitable technique such as trench isolation technology or thick field oxide (FOX) to provide isolation between devices on the wafer 22.

Figure 7:
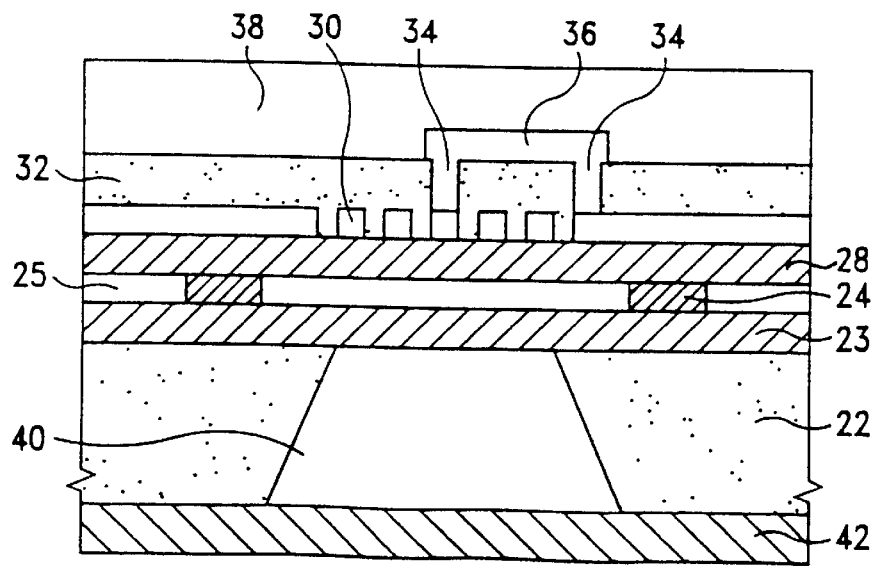

Subsequent steps are the same as the first embodiment described above. As shown in FIG. 7, a silicon dioxide or silicon nitride layer 28 is formed on the silicon layer 25 to act as an insulator layer. A micro inductor 30 is patterned on the insulator layer 28. Via holes 34 are formed in a dielectric layer 32. A connecting conductive layer 36 is patterned on the dielectric layer 32 and refilled into the via holes 34. Next, a passivation layer 38 is deposited on the dielectric layer 32 and the conductive layer 36, for protection.

Similarly, etching is used to etch the wafer 22 from a lower surface (a second surface) of the wafer 22. The etch will stop at the insulator layer 23. Preferably, KOH is used as the etchant to etch the wafer 22. A cavity 40 is also generated and aligned to the inductor 30 to reduce the dielectric loss. A ground plate 42 is connected to the lower surface (second surface) of the wafer 22.

Figure 8:
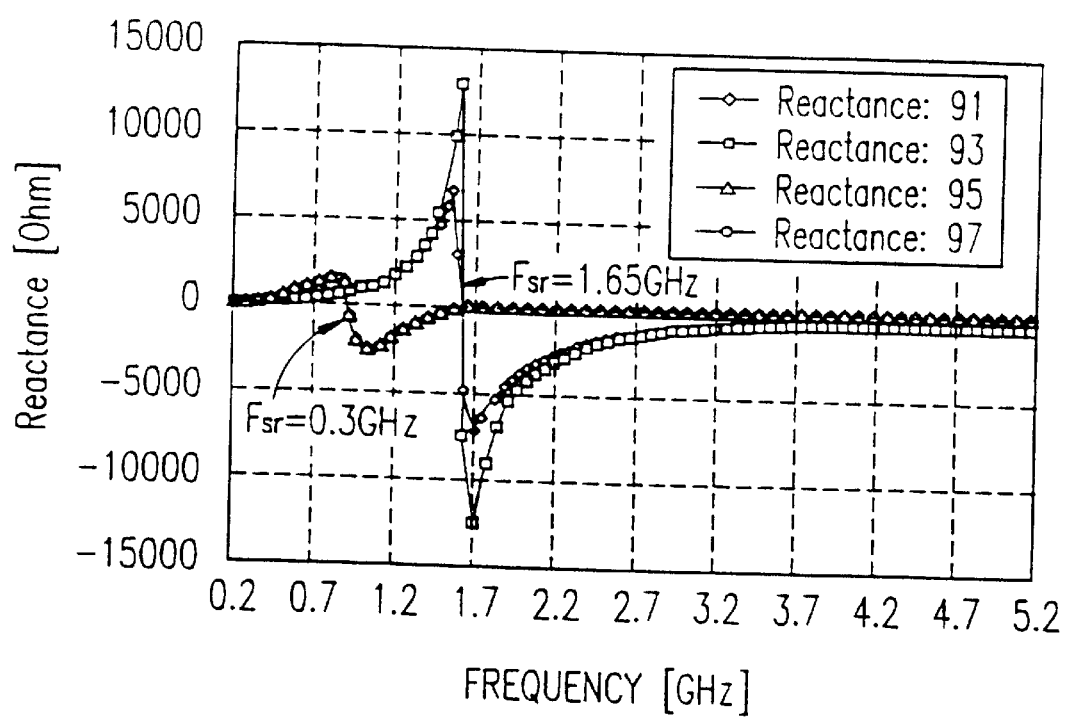
FIG. 8 is a graph showing the relationship between reactance and frequency.

The results of the present invention can be seen in FIG. 8. This figure shows that the measured reactance (Ohms) 91 and modeled reactance (Ohms) 93 according to the present invention vary with frequency. The measured reactance (Ohms) 95 and modeled reactance (Ohms) 97 of the conventional inductor are also shown in FIG. 8. In FIG. 8, the Fsr (self-resonant frequency) according to the present invention is about 1.65 GHz, while the Fsr of the conventional inductor is about 0.8 GHz. Thus, the Fsr of an inductor is improved by the present invention.

As will be understood by persons skilled in the art, the foregoing preferred embodiment of the present invention are illustrative of the present invention rather than limiting the present invention. For example, the present invention uses a stop layer. The stop layer is formed by performing an ion implantation, then the wafer is annealed to form an implanted layer. Alternatively, a SOI structure can also be used to act the etching stop layer. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the present invention.

What is claimed is:

1. A method for forming a microwave device on a semiconductor wafer for integrated circuits, said method comprising the steps of:

forming isolation regions on a first surface of said semiconductor wafer for isolation;

performing an ion implantation to implant ions into said semiconductor wafer from said first surface of of said wafer;

performing an anneal process to react said ions with said semiconductor wafer, thereby forming an implanted layer on said semiconductor wafer to act as an etching stop layer;

forming an insulator layer on said implanted layer;

forming an inductor on said insulator layer;

forming a passivation layer on said inductor;

etching said semiconductor wafer from a second surface of said semiconductor wafer to said implanted layer, thereby generating a cavity in said semiconductor wafer that is aligned to said inductor; and forming a ground plate on said lower surface of said semiconductor wafer.

2. The method of claim 1, wherein said isolation regions is formed by field oxidation technology.

3. The method of claim 1, wherein said isolation regions is formed by trench isolation technology.

4. The method of claim 1, wherein an ion source of said ion implantation is $O_2$.

5. The method of claim 1, wherein an ion source of said ion implantation is $N_2$.

6. The method of claim 1, wherein said insulator is selected from the group consisting of silicon nitride and silicon dioxide.

7. The method of claim 1, wherein an etchant of said etching to etch said semiconductor wafer is KOH.

8. A method for forming a microwave device on a semiconductor wafer for integrated circuits, said method comprising the steps of:

performing an ion implantation to dope ions from a first surface of said semiconductor wafer into said semiconductor wafer to a depth by controlling an energy of said ion implantation;

performing a thermal process to react said ions with said semiconductor wafer, thereby forming a first insulator layer in said semiconductor wafer to have a depth from said first surface of said semiconductor wafer;

forming isolation regions in said silicon layer for isolation, said isolation regions being on said first insulator layer;

forming a second insulator layer on said first surface of said semiconductor wafer and on said isolation regions;

forming an inductor on said second insulator layer;

forming a passivation layer on said inductor;

etching said semiconductor wafer from a second surface of said semiconductor wafer to said first insulator layer, thereby generating a cavity in said semiconductor wafer that is aligned to said inductor; and forming a ground plate on said lower surface of said semiconductor wafer.

9. The method of claim 8, wherein said isolation regions are formed by field oxidation technology.

10. The method of claim 8, wherein said isolation regions are formed by trench isolation technology.

11. The method of claim 8, wherein said first insulator is selected from the group consisting of silicon nitride and silicon dioxide.

12. The method of claim 8, wherein said second insulator is selected from the group consisting of silicon nitride and silicon dioxide.

13. The method of claim 8, wherein an etchant of said etching to etch said semiconductor wafer is KOH.

14. The method of claim 1, wherein an ion source of said ion implantation is $O_2$.

15. The method of claim 1, wherein an ion source of said ion implantation is $N_2$.

* * * * *